United States Patent
Huang et al.

(10) Patent No.: US 8,778,725 B1
(45) Date of Patent: Jul. 15, 2014

(54) AVALANCHE PHOTODIODE WITH SPECIAL LATERAL DOPING CONCENTRATION

(71) Applicant: SiFotonics Technologies Co., Ltd., Woburn, MA (US)

(72) Inventors: Mengyuan Huang, Beijing (CN); Pengfei Cai, Beijing (CN); Dong Pan, Andover, MA (US)

(73) Assignee: SiFotonics Technologies Co, Ltd., Woburn, MA (US)

( * ) Notice: Subject to any disclaimer, the term of this patent is extended or adjusted under 35 U.S.C. 154(b) by 0 days.

(21) Appl. No.: 14/196,125

(22) Filed: Mar. 4, 2014

Related U.S. Application Data

(63) Continuation-in-part of application No. 13/280,649, filed on Oct. 25, 2011, now Pat. No. 8,704,272.

(51) Int. Cl.
  *H01L 21/00* (2006.01)
(52) U.S. Cl.
  USPC .................................. 438/91; 438/48
(58) Field of Classification Search
  USPC ...................................... 438/91, 48
  See application file for complete search history.

(56) References Cited

U.S. PATENT DOCUMENTS

| | | | | |
|---|---|---|---|---|
| 6,515,315 | B1 * | 2/2003 | Itzler et al. | 257/186 |
| 6,743,657 | B2 * | 6/2004 | Dries et al. | 438/91 |
| 2004/0251483 | A1 * | 12/2004 | Ko et al. | 257/292 |
| 2007/0120226 | A1 * | 5/2007 | Nakaji et al. | 257/603 |
| 2009/0020782 | A1 * | 1/2009 | Pan et al. | 257/185 |
| 2009/0121305 | A1 * | 5/2009 | Pan et al. | 257/436 |
| 2009/0242933 | A1 * | 10/2009 | Hu et al. | 257/186 |
| 2011/0068428 | A1 * | 3/2011 | Yasuoka et al. | 257/438 |

\* cited by examiner

*Primary Examiner* — Douglas Menz
(74) *Attorney, Agent, or Firm* — Andy M. Han

(57) ABSTRACT

Avalanche photodiodes having special lateral doping concentration that reduces dark current without causing any loss of optical signals and method for the fabrication thereof are described. In one aspect, an avalanche photodiode comprises: a substrate, a first contact layer coupled to at least one metal contract of a first electrical polarity, an absorption layer, a doped electric control layer having a central region and a circumferential region surrounding the central region, a multiplication layer having a partially doped central region, and a second contact layer coupled to at least one metal contract of a second electrical polarity. Doping concentration in the central section of the electric control layer is lower than that of the circumferential region. The absorption layer can be formed by selective epitaxial growth.

23 Claims, 6 Drawing Sheets

AVALANCHE PHOTODIODE WITH SPECIAL LATERAL DOPING CONCENTRATION

CROSS-REFERENCE TO RELATED PATENT APPLICATIONS

This is a continuation-in-part application claiming the priority benefit of U.S. patent application Ser. No. 13/280,649, entitled "Avalanche Photodiode with Special Lateral Doping Concentration" and filed on Oct. 25, 2011, which claims the priority benefit of U.S. Patent Application Ser. No. 61/571,279, entitled "Ge/Si Avalanche Photodiode with an Undepleted Absorber for High Speed Optical Communication" and filed on Jun. 24, 2011. The aforementioned applications are incorporate by reference in their entirety.

TECHNICAL FIELD

The present disclosure relates to photosensitive devices. More particularly, the present disclosure relates to an avalanche photodiode.

BACKGROUND

An avalanche photodiode (APD) is a type of photosensitive semiconductor device in which light is converted to electricity due to the photoelectric effect coupled with electric current multiplication as a result of avalanche breakdown. APDs differ from conventional photodiodes in that incoming photons internally trigger a charge avalanche in APDs. Avalanche photodiodes are typically employed in laser rangefinder applications and long-range fiber optic telecommunication applications.

One of the parameters that impact the applicability and usefulness of APDs is dark current, which is a type of relatively small electric current that flows through a photosensitive device, such as a photodiode, even when no photons are entering the photosensitive device. Dark current is one of the main sources of noise in photosensitive devices. Consequently, dark current is a limiting factor for Ge/Si APDs in high-speed optical communication applications.

There is, therefore, a need for a novel and non-obvious design of APDs that reduces the effect of dark current to achieve high performance.

SUMMARY

The present disclosure provides APDs having special lateral doping concentration that reduces the dark current without causing any loss of optical signals to achieve high device performance and methods of their fabrication.

In one aspect, an avalanche photodiode may comprise a substrate and a multi-layer structure disposed on the substrate. The multi-layer structure may comprise: a first contact layer coupled to at least one metal contact of a first electrical polarity; an absorption layer on which the first contact layer is disposed, the absorption layer absorbing photons of an optical beam incident on the multi-layer structure; an electric field control layer on which the absorption layer is disposed; a multiplication layer on which the electric field control layer is disposed, the multiplication layer configured such that an avalanche breakdown occurs in the multiplication layer in response to the absorption layer absorbing the photons of the optical beam; and a second contact layer on which the multiplication layer is disposed, the second contact layer coupled to at least one metal contact of a second electrical polarity. The absorption layer may be made of a first material. The electric field control layer may be made of a second material and aids distribution of an electric field inside the multiplication layer. A central region of the electric field control layer may be doped with a first type of dopants at a first level of concentration and a circumferential region of the electric field control layer surrounding the central region is doped with the first type of dopants at a second level of concentration higher than the first level.

In some embodiments, a portion of the central region of the multiplication layer may be doped with a second type of dopants. The second type of dopants may be arsenic, phosphorous, or other n-type dopants for Si.

In some embodiments, one or more of a size, a doping concentration, and a thickness of the central region of the multiplication layer may be controlled so that an electric field in the central region is higher than that of regions of the multiplication layer that surround the central region.

In some embodiments, one or more of a size, a doping concentration, and a thickness of the central region of the electric field control layer may be controlled so that electric field entering into the absorption layer above the circumferential region of the electric field control field is minimized.

In some embodiments, the absorption layer may be made of Ge or other III-IV materials including InGaAsP and InGaAs.

In some embodiments, the electric field control layer may be made of Si, SiGeC or other Si alloys.

In some embodiments, the first type of dopants may be boron, $BF_2$ or other p-type dopants for Si.

In some embodiments, the multiplication layer may be made of Si.

In some embodiments, the substrate may comprise a Si substrate or a silicon-on-insulator (SOI) substrate.

In another aspect, a method of making an avalanche photodiode, may comprise: forming a second contact layer on a substrate, the second contact layer coupled to at least one metal contact of a second electrical polarity; forming a multiplication layer on the second contact layer; forming an electric field control layer on the multiplication layer, the electric field control layer doped with a first type of dopants; forming an absorption layer on the electric field control layer; and forming a first contact layer on the absorption layer, the first contact layer coupled to at least one metal contact of a first electrical polarity. In some embodiments, the method may further comprise doping a portion of a central region of the multiplication layer with a second type of dopants.

In some embodiments, the absorption layer may be formed by selective epitaxial growth.

In some embodiments, the selective epitaxial growth may comprise causing the selective epitaxial growth by using molecular beam epitaxy, chemical vapor deposition, or vapor phase epitaxy.

In yet another aspect, an avalanche photodiode may comprise a substrate and a multi-layer structure disposed on the substrate. The multi-layer structure may comprise: a first contact layer coupled to at least one metal contact of a first electrical polarity; an absorption layer on which the first contact layer is disposed, the absorption layer absorbing photons of an optical beam incident on the multi-layer structure; an electric field control layer on which the absorption layer is disposed; a multiplication layer on which the electric field control layer is disposed, the multiplication layer configured such that an avalanche breakdown occurs in the multiplication layer in response to the absorption layer absorbing the photons of the optical beam; and a second contact layer on which the multiplication layer is disposed, the second contact layer coupled to at least one metal contact of a second electrical polarity. The absorption layer may be made of a first material. The electric field control layer may be made of a second material and aids distribution of an electric field inside the multiplication layer. A central region of the electric field control layer may be doped with a first type of dopants at a first level of concentration and a circumferential region of the electric field control layer surrounding the central region is doped with the first type of dopants at a second level of concentration higher than the first level. A portion of a central region of the multiplication layer may be doped with a second type of dopants.

In some embodiments, one or more of a size, a doping concentration, and a thickness of the central region of the electric field control layer may be controlled so that electric field entering into the absorption layer above the circumferential region of the electric field control field is minimized.

In some embodiments, one or more of a size, a doping concentration, and a thickness of the central region of the multiplication layer may be controlled so that an electric field in the central region is higher than that of regions of the multiplication layer that surround the central region.

In some embodiments, the second type of dopants may be arsenic, phosphorous, or other n-type dopants for Si.

In some embodiments, the absorption layer may be made of Ge or other III-IV materials including InGaAsP and InGaAs.

In some embodiments, the electric field control layer may be made of Si, SiGeC or other Si alloys.

In some embodiments, the first type of dopants may be boron, $BF_2$ or other p-type dopants for Si.

In some embodiments, the multiplication layer may be made of Si.

In some embodiments, the substrate may comprise a Si substrate or a silicon-on-insulator (SOI) substrate.

In still another aspect, a method of fabricating an APD may include: heavily doping a substrate with dopants of a second electrical polarity; depositing a first intrinsic Si layer on the substrate; forming a current confinement layer by implanting the first intrinsic Si layer with dopants of the second electrical polarity; depositing a second intrinsic Si layer on the current confinement layer to form a multiplication layer; implanting a top portion of the multiplication layer with dopants of a first electrical polarity to form an electric field control layer; depositing an intrinsic Ge layer on the electric field control layer to form an absorption layer; depositing an intrinsic amorphous Si layer on the absorption layer; implanting the intrinsic amorphous Si layer with dopants of the first electrical polarity to form a contact layer; and performing silicide formation and metallization.

In some embodiments, the dopants of the first electrical polarity may be p-type dopants, and the dopants of the second electrical polarity may be n-type dopants.

In some embodiments, heavily doping the substrate with dopants of the second electrical polarity may include heavily doping the substrate with arsenic, phosphorous, antimony or another n-type dopants for Si. A concentration of the dopants of the second electrical polarity in the substrate may be higher than approximately $1e19/cm^3$.

In some embodiments, heavily doping the substrate with dopants of the second electrical polarity may include depositing a Si layer on the substrate with in-situ doping.

In some embodiments, a thickness of the current confinement layer may be in a range of approximately 20 nm to approximately 400 nm.

In some embodiments, the method may further include heavily doping a central region of the current confinement layer with dopants of the second electrical polarity.

In some embodiments, the central region of the current confinement layer may be doped with arsenic, phosphorous, antimony or another n-type dopants for Si. A concentration of the dopants of the second electrical polarity in the central region of the current confinement layer may be in a range between approximately $5e16/cm^3$ to approximately $1e19/cm^3$.

In some embodiments, a surrounding region of the current confinement layer that surrounds the central region of the current confinement layer may be undoped or doped with dopants of the second electrical polarity. A concentration of the dopants of the second electrical polarity in the surrounding region of the current confinement layer may be less than approximately $1e16/cm^3$.

In some embodiments, heavily doping the central region of the current confinement layer may include implanting the central region of the current confinement layer. In some embodiments, the implanting may include implanting with ion dosage between approximately $5e12/cm^2$ and approximately $1e15/cm^2$ and with an implantation energy between approximately 50 keV and approximately 300 keV.

In some embodiments, a thickness of the multiplication layer may be in a range of approximately 100 nm to approximately 1000 nm.

In some embodiments, the electric field control layer may include Si, SiGe, SiGeC or another Si alloy. A thickness of the electric field control layer may be in a range of approximately 30 nm to approximately 200 nm.

In some embodiments, the method may further include slightly doping a central region of the electric field control layer with dopants of the first electrical polarity.

In some embodiments, slightly doping the central region of the electric control field may include doping the central region of the electric field control layer with boron or another p-type dopants for Si. A concentration of the dopants of the first electrical polarity in the central region of the electric field control layer may be in a range between approximately $3e16/cm^3$ and approximately $5e18/cm^3$.

In some embodiments, the method may further include doping a surrounding region of the electric control field that surrounds the central region of the electric field control layer with dopants of the first electrical polarity having a concentration higher than that of the central region of the electric control field.

In some embodiments, doping the central region of the electric field control layer may include implanting the central region of the electric field control layer.

In some embodiments, the implanting may include implanting with ion dosage between approximately $3e11/cm^2$ and approximately $5e13/cm^2$ and with an implantation energy between approximately 5 keV and approximately 100 keV.

In some embodiments, the absorption layer may include Ge, SiGe, another Ge alloy, or other III-V materials including InGeAs or InGaAsP. A thickness of the absorption layer may be in a range of approximately 200 nm to approximately 4000 nm.

In some embodiments, the contact layer may include amorphous Si, Ge, SiGe or other III-V materials. A thickness of the contact layer may be in a range of approximately 20 nm to approximately 400 nm.

In some embodiments, the method may further include heavily doping the contact layer with dopants of the first electrical polarity with a concentration higher than approximately $1e19/cm^3$.

In some embodiments, the method may further include applying ion implantation to a central region of the substrate before intrinsic Si epitaxial growth.

In some embodiments, the depositing may include non-selective epitaxial growth or selective epitaxial growth.

In some embodiments, the depositing may include depositing by chemical vapor deposition (CVD).

These and other features, aspects, and advantages of the present disclosure will be explained below with reference to the following figures. It is to be understood that both the foregoing general description and the following detailed description are by examples, and are intended to provide further explanation of the present disclosure as claimed.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain the principles of the present disclosure. The drawings may not necessarily be in scale so as to better present certain features of the illustrated subject matter.

DETAILED DESCRIPTION OF THE PREFERRED EMBODIMENTS

Overview

Figure 1:
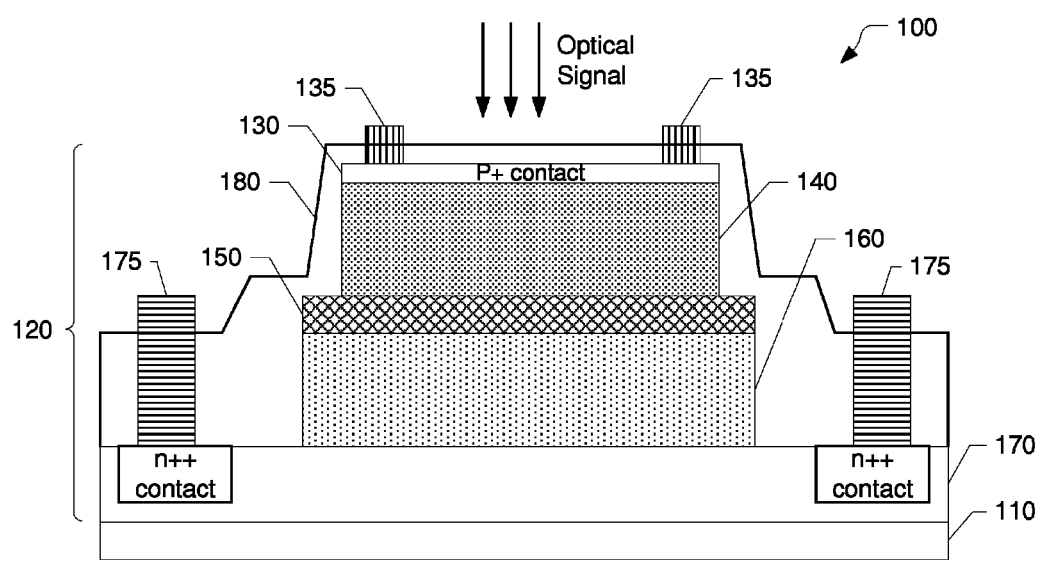
FIG. 1 is a cross-sectional view of a conventional APD.

The present disclosure provides APDs having lateral doping concentration that reduces the effect of dark current without causing any loss of optical signals to achieve high device performance and method for their fabrication. FIGS. 1-3 are not drawn to scale and are provided to convey the concept of the various embodiments of the present disclosure.

Example Embodiments

FIG. 1 is a cross-sectional view of a conventional APD. Referring to FIG. 1, a typical APD 100 has a substrate 110 made of silicon (Si) and a multi-layer structure 120 disposed on the substrate 110. The multi-layer structure 120 includes a first-type contact layer 130 coupled to at least one first-type metal contact 135, an absorption layer 140 made of germanium (Ge) on which the first-type contract layer 130 is disposed, an electric field control layer 150 made of first-type Si on which the absorption layer 140 is disposed, a multiplication layer 160 made of Si on which the electric field control layer 150 is disposed, and a second-type contact layer 170 made of second-type Si on which the multiplication layer 160 is disposed. The APD 100 has at least one second-type metal contact 175 coupled to the second-type contact layer 170. The APD 100 further has an anti-reflection coating 180 that covers the multi-layer structure 120.

Representative APDs of the present disclosure are schematically shown in cross-sectional views in FIGS. 2A, 2B, 3A and 3B.

Figure 2A:
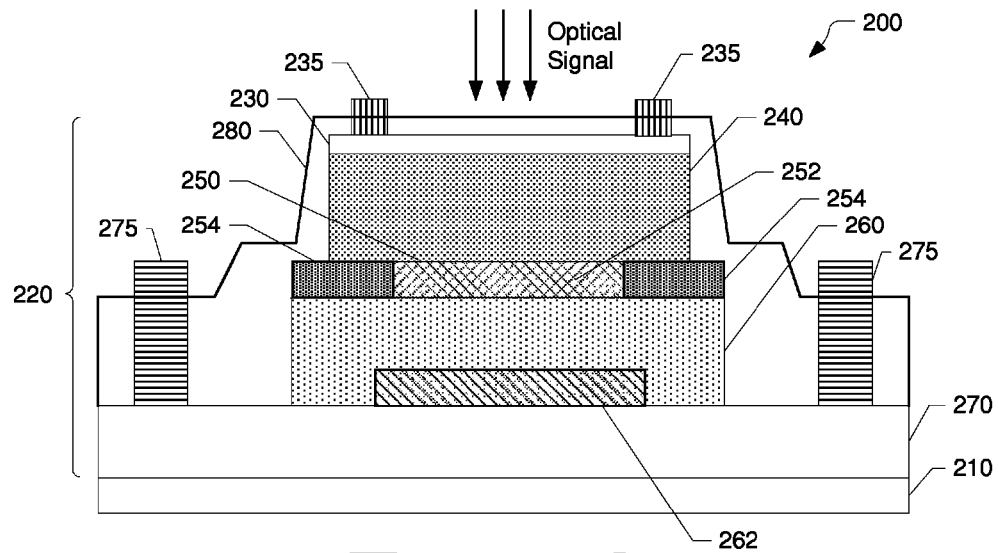
FIG. 2A is a cross-sectional view of an APD in accordance with an embodiment of the present disclosure.

FIG. 2A is a cross-sectional view of an APD 200 in accordance with an embodiment of the present disclosure. Referring to FIG. 2, the APD 200 may comprise a substrate 210 and a multi-layer structure 220 disposed on the substrate 210. The multi-layer structure 220 may comprise: a first-type contact layer 230 coupled to at least one first-type metal contact 235, an absorption layer 240 made of Ge on which the first-type contract layer 230 is disposed, an electric field control layer 250 made of first-type Si on which the absorption layer 240 is disposed, a multiplication layer 260 made of Si on which the electric field control layer 250 is disposed, and a second-type contact layer 270 made of second-type Si on which the multiplication layer 260 is disposed. At least one second-type metal contact 275 is coupled to the contact layer 270. The APD 200 may further comprise an anti-reflection coating 280 that covers the multi-layer structure 220.

In some embodiments, a central region 252 of the electric field control layer 250 is doped with a first type of dopants at a first level of concentration, and a circumferential region 254 of the electric field control layer 250 surrounding, or encircling, the central region 252 is doped with the first type of dopants at a second level of concentration that is higher than the first level of concentration. In other words, the circumferential region 254 may be seen as a "guard ring" encircling the central region 252 and having a higher concentration of the first type of dopants than that of the central region 252. The first type of dopants may be, for example, boron, BF2 or other p-type dopants for Si.

In some embodiments, a central region 262 of the multiplication layer 260 is doped with a second type of dopants. The second type of dopants may be, for example, arsenic, phosphorous, or other n-type dopants for Si.

In some embodiments, the absorption layer 240 comprise Ge or other III-IV materials, such as InGaAsP or InGaAs, which have a large lattice mismatch with the substrate 210.

In some embodiments, one or more factors, such as the size, doping concentration and thickness of the guard ring, or the circumferential region 254 of the electric field control layer 250, are controlled to prevent or minimize charge carriers, or electric field, from moving into the absorption layer 240.

In some embodiments, one or more factors, such as the size, doping concentration and thickness of the partially doped region, or the central region 262, of multiplication layer 260 are controlled so that the electric field in the central region 262 is higher than the electric field in other regions of the multiplication layer 260, such as those regions of the multiplication layer 260 that surround the central region 262. Since the central region 262 of the multiplication layer 260 is the main path of photo-generated carriers, it is necessary to maintain a high electric field in the central region 262 for the avalanche process to occur. This design keeps the electric field low in regions of the multiplication layer 260 that surround the central region 262 to avoid excessive noise during the avalanche process.

In some embodiments, the substrate 210 is a Si substrate or a silicon-on-insulator (SOI) substrate.

Figure 2B:
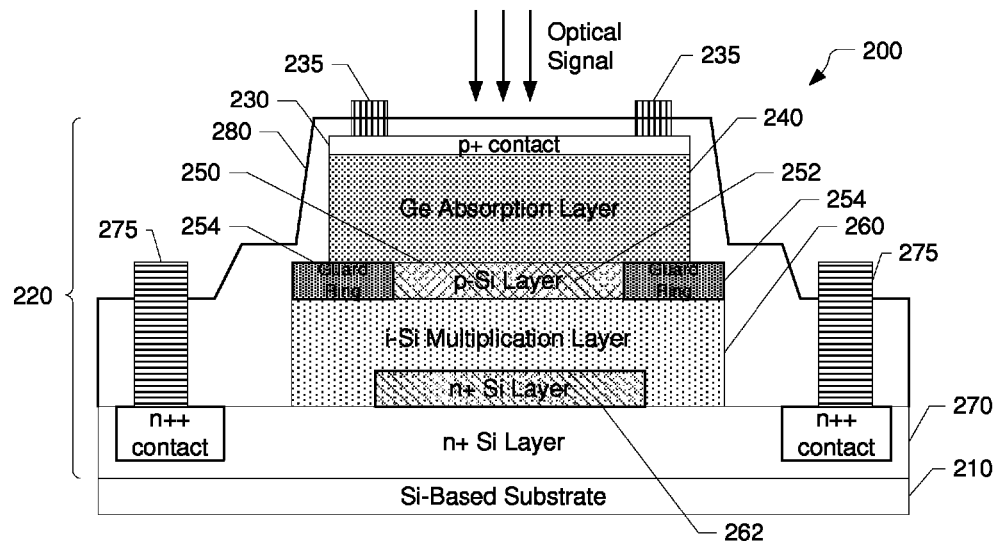
FIG. 2B is a cross-sectional view of an APD in accordance with an embodiment of the present disclosure.

FIG. 2B illustrates an example embodiment of the APD 200. In this embodiment, the substrate 210 is a silicon-based substrate, the first-type contact layer 230 is a p-type contact layer coupled to at least one p-type metal contact 235, the absorption layer 240 is a blanket Ge absorption layer, the electric field control layer 250 is a p-type Si layer, the multiplication layer 260 is a Si multiplication layer, and the second-type contact layer 270 is an n-type Si layer coupled to at least one n-type metal contact 275.

Figure 3A:
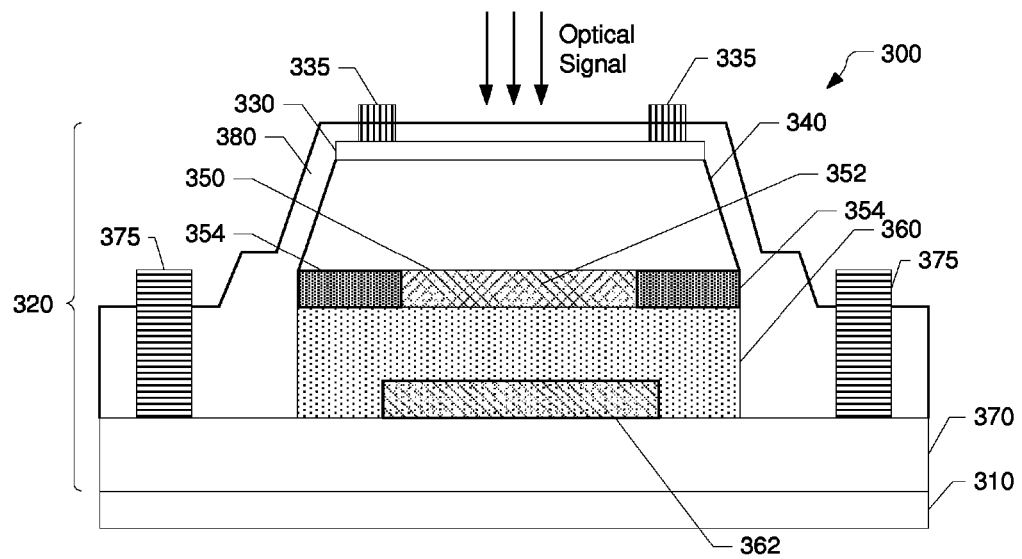
FIG. 3A is a cross-sectional view of an APD in accordance with an embodiment of the present disclosure.

FIG. 3A is a cross-sectional view of an APD 300 in accordance with an embodiment of the present disclosure. Referring to FIG. 3, the APD 300 may comprise a substrate 310 and a multi-layer structure 320 disposed on the substrate 310. The multi-layer structure 320 may comprise: a first-type contact layer 330 coupled to at least one first-type metal contact 335, an absorption layer 340 made of Ge on which the first-type contract layer 330 is disposed, an electric field control layer 350 made of first-type Si on which the absorption layer 340 is disposed, a multiplication layer 360 made of Si on which the electric field control layer 350 is disposed, and a second-type contact layer 370 made of second-type Si on which the multiplication layer 360 is disposed. At least one second-type metal contact 375 is coupled to the contact layer 370. The APD 300 may further comprise an anti-reflection coating 380 that covers the multi-layer structure 320.

The basic structure of the APD 300 is similar to that of APD 200 except that the absorption layer 340 is disposed on the electric field control layer 350 by selective epitaxial growth (SEG) which may comprise, for example, causing the selective epitaxial growth by using molecular beam epitaxy, chemical vapor deposition, or vapor phase epitaxy.

In some embodiments, a central region 352 of the electric field control layer 350 is doped with a first type of dopants at a first level of concentration, and a circumferential region 354 of the electric field control layer 350 surrounding, or encircling, the central region 352 is doped with the first type of dopants at a second level of concentration that is higher than the first level of concentration. In other words, the circumferential region 354 may be seen as a "guard ring" encircling the central region 352 and having a higher concentration of the first type of dopants than that of the central region 352. The first type of dopants may be, for example, boron, $BF_2$ or other p-type dopants for Si.

In some embodiments, a central region 362 of the multiplication layer 360 is doped with a second type of dopants. The second type of dopants may be, for example, arsenic, phosphorous, or other n-type dopants for Si.

In some embodiments, the absorption layer 340 comprise Ge or other III-IV materials, such as InGaAsP or InGaAs, which have a large lattice mismatch with the substrate 310.

In some embodiments, one or more factors, such as the size, doping concentration and thickness of the guard ring, or the circumferential region 354 of the electric field control layer 350, are controlled to prevent or minimize charge carriers, or electric field, from moving into the absorption layer 340.

In some embodiments, one or more factors, such as the size, doping concentration and thickness of the partially doped region, or the central region 362, of multiplication layer 360 are controlled so that the electric field in the central region 362 is higher than the electric field in other regions of the multiplication layer 360, such as those regions of the multiplication layer 360 that surround the central region 362.

In some embodiments, the substrate 310 is a Si substrate or an SOI substrate.

Figure 3B:
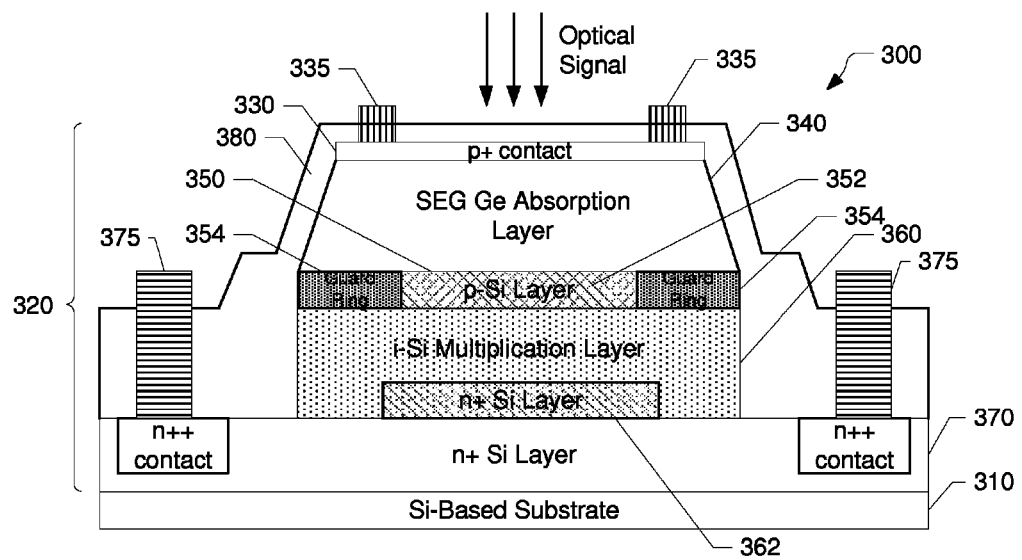
FIG. 3B is a cross-sectional view of an APD in accordance with an embodiment of the present disclosure.

FIG. 3B illustrates an example embodiment of the APD 300. In this embodiment, the substrate 310 is a silicon-based substrate, the first-type contact layer 330 is a p-type contact layer coupled to at least one p-type metal contact 335, the absorption layer 340 is an SEG Ge absorption layer, the electric field control layer 350 is a p-type Si layer, the multiplication layer 360 is a Si multiplication layer, and the second-type contact layer 370 is an n-type Si layer coupled to at least one n-type metal contact 375.

Example Test Results

The higher doping concentration in the central region 262, 362 of the multiplication layer 260, 360 can be achieved by: (i) depositing a thin layer (<200 nm) of Si on wafers (thinner than the multiplication layer 260, 360), and implanting with masks to result in the higher concentration in the central region 260, 360, and then depositing Si to reach the thickness of the multiplication layer 260, 360; or (ii) directly implanting (with masks) on wafers to make a higher concentration in the central region of the wafer surface, and depositing Si layer to form the multiplication layer 260, 360. The formation of the guard ring, or circumferential region 254, 354 in the electric field control layer 250, 350 can be achieved by two rounds of implantations. The first implantation is to form the electric filed control layer 250, 350 using a conventional method. The second implantation (with masks) is to increase the doping concentration at certain regions, namely the guard ring, or circumferential region 254, 354.

Figure 4:
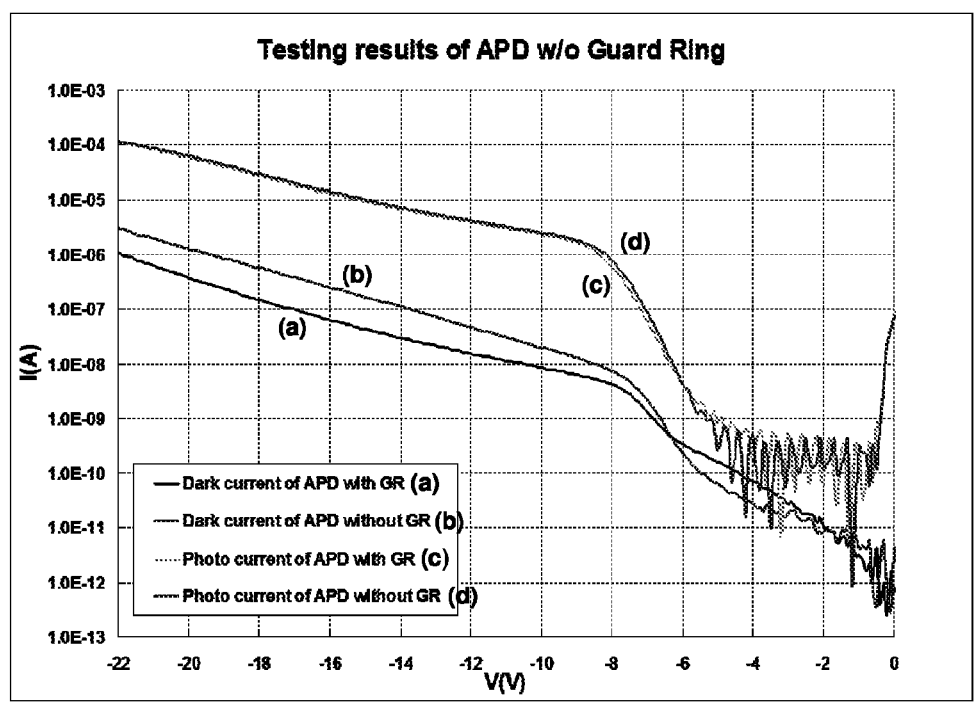
FIG. 4 is a chart showing test results of a conventional APD and an APD in accordance with the present disclosure.

FIG. 4 is a chart 400 showing test results of a conventional APD and an APD in accordance with the present disclosure, such as the APD 200 of FIG. 2 or the APD 300 of FIG. 3. The vertical axis represents current in units of ampere and the horizontal axis represents voltage in units of voltage. Curve (a) in FIG. 4 is the dark current of an APD in accordance with the present disclosure. Curve (b) in FIG. 4 is the dark currant of a conventional APD. Curve (c) in FIG. 4 is the photo current of an APD in accordance with the present disclosure. Curve (d) in FIG. 4 is the photo current of a conventional APD. FIG. 4 demonstrates that the presence of a guard ring, such as the central region 252 of the electric field control layer 250 in the APD 200 or the central region 252 of the electric field control layer 250 in the APD 300, can effectively decrease device dark current. Meanwhile, it does not cause any loss of optical signals. As a result, device performance is greatly improved.

Example Fabrication Process

Figure 5:
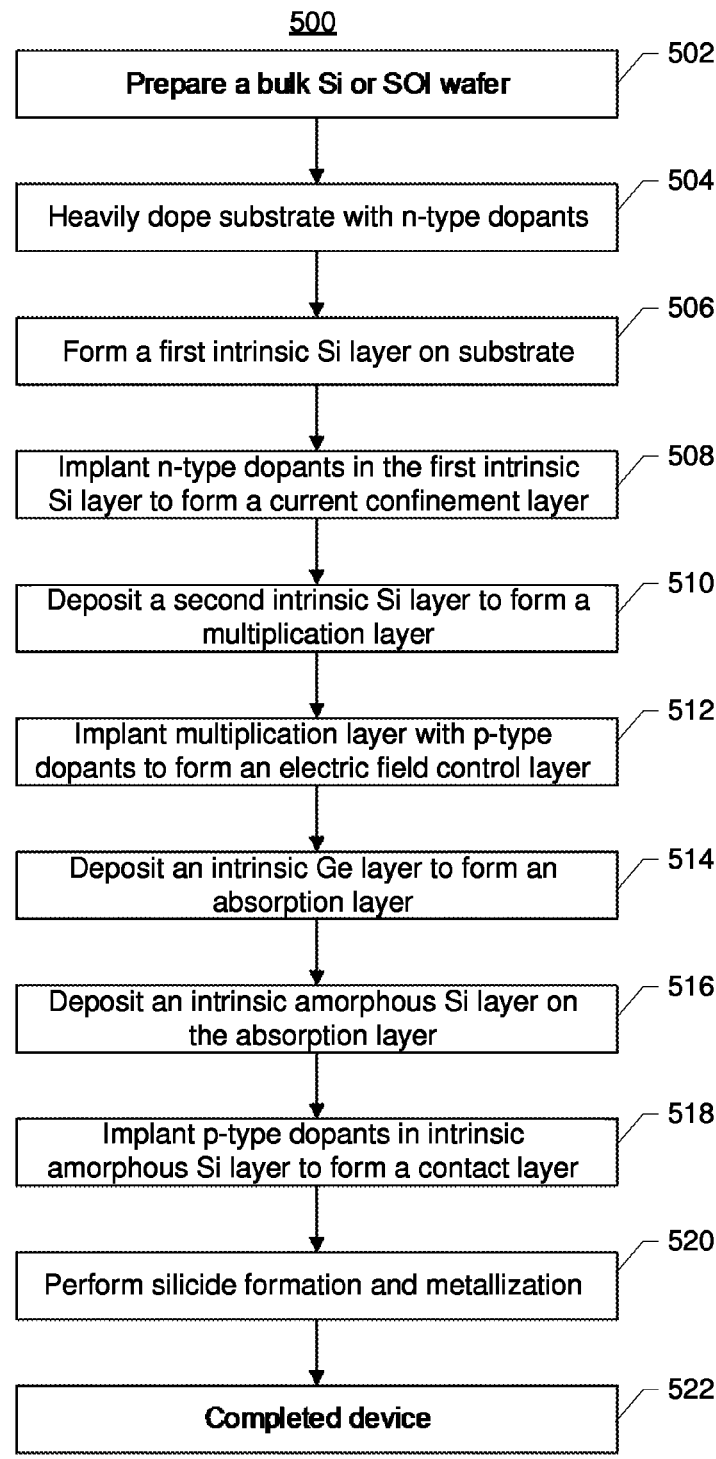
FIG. 5 is a flowchart of a process of fabrication of an APD in accordance with an embodiment of the present disclosure.

FIG. 5 shows an example process 500 of fabrication of an APD in accordance with the present disclosure. Process 500 may include one or more operations, actions, or functions depicted by one or more blocks 502-522. Although illustrated as discrete blocks, various blocks may be divided into additional blocks, combined into fewer blocks, or eliminated, depending on the desired implementation. Process 500 may begin at block 502.

At 502, process 500 prepares a substrate with a Si or silicon-on-insulator (SOI) wafer.

At 504, process 500 dopes the substrate with dopants of the second electrical polarity (e.g., n-type dopants). For example, the substrate may be heavily doped with n-type dopants like arsenic, phosphorous, antimony or other n-type dopants for Si. The doping process may be done by implantation, and the doping concentration in substrate layer may be higher than approximately $1e19/cm^3$.

In one embodiment, the heavily doped substrate may be formed by depositing a Si layer on the substrate with in-situ doping.

At 506, process 500 deposits a first intrinsic Si layer on the substrate. For example, the first intrinsic Si layer may be formed by deposition.

At 508, process 500 implants the first intrinsic Si layer with dopants of the second electrical polarity to form a current confinement layer on the substrate.

In one embodiment, the current confinement layer on the substrate may have a thickness in the range of approximately 20 nm to approximately 400 nm.

In one embodiment, process 500 may heavily dope a central region of the current confinement layer with dopants of the second electrical polarity such as, for example, arsenic, phosphorous, antimony or other n-type dopants for Si. The doping concentration in the central region of the current confinement layer may be between approximately $5e16/cm^3$ to approximately $1e19/cm^3$. In one embodiment, a surrounding region of the current confinement layer that surrounds the central region thereof may be undoped or unintentionally doped with dopants of the second electrical polarity with a concentration of less than approximately $1e16/cm^3$.

In one embodiment, the doping of the current confinement layer may be done by implantation. In one embodiment, the ion dosage may be between approximately $5e12/cm^2$ and approximately $1e15/cm^2$, and the implantation energy may be between approximately 50 keV and approximately 300 keV.

In one embodiment, process 500 may form the current confinement layer by additional ion implantation process applied to the central region of the substrate before intrinsic Si epitaxial growth. In one embodiment, the additional ion implantation may apply dopants with high diffusivity in Si (e.g., phosphorous), and the implantation energy may be very low to form a region of high concentration of dopants at the substrate surface. Additionally, process 500 may then follow thermal treatments to cause the dopants to diffuse into the central region of the current confinement layer.

At 510, process 500 deposits a second intrinsic Si layer on the current confinement layer to form a multiplication layer.

In one embodiment, the multiplication layer may have a thickness in the range of approximately 100 nm to approximately 1000 nm.

At 512, process 500 implants a top portion of the multiplication layer with dopants of the first electrical polarity (e.g., p-type dopants) to form an electric field control layer.

In one embodiment, the electric field control layer may comprise Si, SiGe, SiGeC or other Si alloys with a thickness in the range of approximately 30 nm to approximately 200 nm.

In one embodiment, a central region of the electric field control layer may be slightly doped with dopants of the first electrical polarity such as, for example, boron or other p-type dopants for Si. In one embodiment, the doping concentration in the central region of the electric field control layer may be between approximately $3e16/cm^3$ and approximately $5e18/cm^3$. In one embodiment, a surrounding region of the electric field control layer the surrounds the central region thereof may also be doped with dopants of the first electrical polarity, and may have a higher concentration than the central region.

In one embodiment, the doping of the electric field control layer may be done by implantation with dosage between approximately $3e11/cm^2$ and approximately $5e13/cm^2$, and the implantation energy may be between approximately 5 keV and approximately 100 keV.

At 514, process 500 deposits an intrinsic Ge layer on the electric field control layer to form an absorption layer.

In one embodiment, the absorption layer may comprise Ge, SiGe, other Ge alloys or other III-V materials including InGaAs and InGaAsP, and may have a thickness in the range of approximately 200 nm to approximately 4000 nm.

At 516, process 500 deposits an intrinsic amorphous Si layer on the absorption layer.

At 518, process 500 implants the intrinsic amorphous Si layer with dopants of the first electrical polarity to form a contact layer.

In one embodiment, the contact layer may comprise amorphous Si, Ge, SiGe, or other III-V materials, and may have a thickness in the range of approximately 20 nm to approximately 400 nm.

In one embodiment, the contact layer may be heavily doped with dopants of the first electrical polarity such as, for example, boron or other p-type dopants for Si, and may have a concentration higher than approximately $1e19/cm^3$.

At 520, process 500 performs silicide formation and metallization.

At 522, process 500 ends with a completed APD device.

In one embodiment, the deposition of the aforementioned layers (e.g., current confinement layer, the multiplication layer, the absorption layer, the contact layer, etc.) may be performed by either non-selective epitaxial growth or selective epitaxial growth. Additionally, the deposition may be performed by using epitaxial tools including chemical vapor deposition (CVD).

Figure 6:
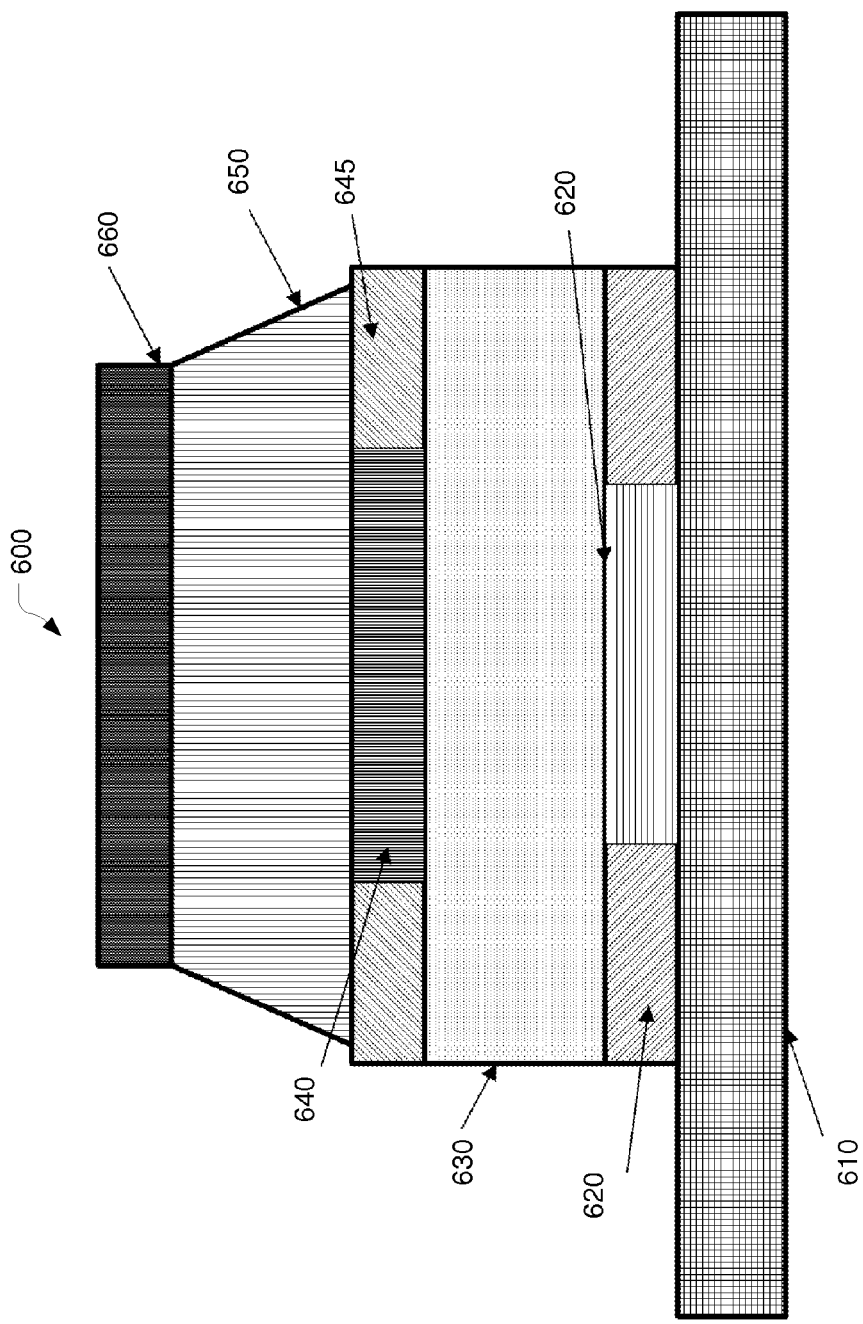
FIG. 6 is a cross-sectional view of an APD fabricated in accordance with the process of FIG. 5.

FIG. 6 is a cross-sectional view of an APD 600 fabricated in accordance with the process of FIG. 5. As shown in FIG. 6, APD 600 includes a substrate 600. The substrate 600 may be a Si substrate or a SOI substrate. APD 600 includes a current confinement layer deposited on the substrate 600. The current confinement layer of APD 600 includes a central region 620 surrounded by a surrounding region 625. APD 600 also includes a multiplication layer 630 deposited on the current confinement layer. A top portion of the multiplication layer 630 includes an electric field control layer. The electric field control layer includes a central region 640 surrounded by a surrounding region 645. APD 600 also includes an absorption layer 650 deposited on the electric field control layer. APD 600 further includes a contact layer 660 deposited on the APD 650. As details of embodiments of each layer of APD 600 have been described above in the description of process 500, the description thereof will not be repeated in the interest of brevity.

Conclusion

Although some embodiments are disclosed above, they are not intended to limit the scope of the present disclosure. It will be apparent to those skilled in the art that various modifications and variations can be made to the disclosed embodiments of the present disclosure without departing from the scope or spirit of the present disclosure. In view of the foregoing, the scope of the present disclosure shall be defined by the following claims and their equivalents.

What is claimed is:

1. A method of fabricating an avalanche photodiode (APD), comprising:

heavily doping a substrate with dopants of a second electrical polarity;

depositing a first intrinsic Si layer on the substrate;

forming a current confinement layer by implanting the first intrinsic Si layer with dopants of the second electrical polarity;

depositing a second intrinsic Si layer on the current confinement layer to form a multiplication layer;

implanting a top portion of the multiplication layer with dopants of a first electrical polarity to form an electric field control layer;

depositing an intrinsic Ge layer on the electric field control layer to form an absorption layer;

depositing an intrinsic amorphous Si layer on the absorption layer;

implanting the intrinsic amorphous Si layer with dopants of the first electrical polarity to form a contact layer; and performing silicide formation and metallization.

2. The method of claim 1, wherein the dopants of the first electrical polarity comprise p-type dopants, and wherein the dopants of the second electrical polarity comprise n-type dopants.

3. The method of claim 2, wherein heavily doping the substrate with dopants of the second electrical polarity comprises heavily doping the substrate with arsenic, phosphorous, antimony or another n-type dopants for Si, and wherein a concentration of the dopants of the second electrical polarity in the substrate is higher than approximately $1e19/cm^3$.

4. The method of claim 1, wherein heavily doping the substrate with dopants of the second electrical polarity comprises depositing a Si layer on the substrate with in-situ doping.

5. The method of claim 1, wherein a thickness of the current confinement layer is in a range of approximately 20 nm to approximately 400 nm.

6. The method of claim 1, further comprising heavily doping a central region of the current confinement layer with dopants of the second electrical polarity.

7. The method of claim 6, wherein the central region of the current confinement layer is doped with arsenic, phosphorous, antimony or another n-type dopants for Si, and wherein a concentration of the dopants of the second electrical polarity in the central region of the current confinement layer is in a range between approximately $5e16/cm^3$ to approximately $1e19/cm^3$.

8. The method of claim 6, wherein a surrounding region of the current confinement layer that surrounds the central region of the current confinement layer is undoped or doped with dopants of the second electrical polarity, and wherein a concentration of the dopants of the second electrical polarity in the surrounding region of the current confinement layer is less than approximately $1e16/cm^3$.

9. The method of claim 6, wherein heavily doping the central region of the current confinement layer comprises implanting the central region of the current confinement layer.

10. The method of claim 9, wherein the implanting comprises implanting with ion dosage between approximately $5e12/cm^2$ and approximately $1e15/cm^2$ and with an implantation energy between approximately 50 keV and approximately 300 keV.

11. The method of claim 1, wherein a thickness of the multiplication layer is in a range of approximately 100 nm to approximately 1000 nm.

12. The method of claim 1, wherein the electric field control layer comprises Si, SiGe, SiGeC or another Si alloy, and wherein a thickness of the electric field control layer is in a range of approximately 30 nm to approximately 200 nm.

13. The method of claim 1, further comprising slightly doping a central region of the electric field control layer with dopants of the first electrical polarity.

14. The method of claim 13, wherein slightly doping the central region of the electric control field comprises doping the central region of the electric field control layer with boron or another p-type dopants for Si, and wherein a concentration of the dopants of the first electrical polarity in the central region of the electric field control layer is in a range between approximately $3e16/cm^3$ and approximately $5e18/cm^3$.

15. The method of claim 13, further comprising doping a surrounding region of the electric control field that surrounds the central region of the electric field control layer with dopants of the first electrical polarity having a concentration higher than that of the central region of the electric control field.

16. The method of claim 13, wherein doping the central region of the electric field control layer comprises implanting the central region of the electric field control layer.

17. The method of claim 16, wherein the implanting comprises implanting with ion dosage between approximately $3e11/cm^2$ and approximately $5e13/cm^2$ and with an implantation energy between approximately 5 keV and approximately 100 keV.

18. The method of claim 1, wherein the absorption layer comprises Ge, SiGe, another Ge alloy, or other III-V materials including InGeAs or InGaAsP, and wherein a thickness of the absorption layer is in a range of approximately 200 nm to approximately 4000 nm.

19. The method of claim 1, wherein the contact layer comprises amorphous Si, Ge, SiGe or other III-V materials, and wherein a thickness of the contact layer is in a range of approximately 20 nm to approximately 400 nm.

20. The method of claim 1, further comprising heavily doping the contact layer with dopants of the first electrical polarity with a concentration higher than approximately $1e19/cm^3$.

21. The method of claim 1, further comprising applying ion implantation to a central region of the substrate before intrinsic Si epitaxial growth, wherein the ion implantation applies phosphorous dopants with an implantation energy that is very low to form a region of high concentration of the phosphorous dopants at a surface of the substrate, the method further comprises applying subsequent thermal treatments to cause the phosphorous dopants to diffuse into the central region of the current confinement layer.

22. The method of claim 1, wherein the depositing comprises non-selective epitaxial growth or selective epitaxial growth.

23. The method of claim 1, wherein the depositing comprises depositing by chemical vapor deposition (CVD).

* * * * *